United States Patent [19]

Normington

[11] 3,746,945

[45] July 17, 1973

[54] SCHOTTKY DIODE CLIPPER DEVICE

[75] Inventor: Peter J. C. Normington, Scottsdale, Ariz.

[73] Assignee: Motorola, Inc., Franklin Park, Ill.

[22] Filed: Oct. 27, 1971

[21] Appl. No.: 194,608

[52] U.S. Cl. .. 317/235 R, 317/235 E, 317/235 UA, 317/234 W

[51] Int. Cl. ........ H01l 5/00

[58] Field of Search ........ 317/234, 235

[56] References Cited

UNITED STATES PATENTS

| | | | |
|---|---|---|---|
| 3,117,260 | 1/1964 | Noyce | 317/235 |
| 3,579,278 | 5/1971 | Heer | 317/234 |

*Primary Examiner*—John W. Huckert
*Assistant Examiner*—E. Wojciechowicz
*Attorney*—Vincent Rauner and Henry Olsen et al.

[57] ABSTRACT

A pair of Schottky barrier diodes formed on a single substrate of semiconductor material so that they are connected in a parallel opposed relationship and a lead may be attached to each side thereof in axially outwardly extending relationship.

7 Claims, 6 Drawing Figures

SCHOTTKY DIODE CLIPPER DEVICE

BACKGROUND OF THE INVENTION

1. Field of the Invention

Diode limiters are a well known and useful device wherein a pair of diodes are connected in parallel opposed relationship limits a signal source. Whenever the signal becomes sufficiently high in amplitude, in either direction, to forward bias one of the diodes, the forward bias diode begins to conduct and limits or clips the signal at that value. Since the pair of diodes are always utilized in a parallel opposed relationship, it is advantageous to place them both in a single package having only two connecting leads thereto.

2. Description of the Prior Art

In the prior art, some bidirectional semiconductor devices have been constructed for use in power circuits for controlling the amount of alternating current power delivered to a load. Such a device is described in U. S. Pat. No. 3,346,874. However, it should be noted that these bidirectional semiconductor devices are relatively complicated and expensive to manufacture.

SUMMARY OF THE INVENTION

The present invention pertains to an improved diode clipper device wherein Schottky barrier diodes are formed on opposite sides of a semiconductor substrate and are separated by a layer of material containing impurities for providing conductivity of a type opposite to that of the portion of the semiconductor substrate forming each of the Schottky barrier diodes. The Schottky barrier diodes turn on at a voltage of approximately 2/10 of a volt while the semiconductor junctions formed between the portions of substrate having different types of conductivity turn on at approximately 0.7 volts. Thus, the semiconductor junctions in the substrate separate the Schottky diodes to prevent interaction therebetween.

It is an object of the present invention to provide an improved diode clipper device.

It is a further object of the present invention to provide an improved diode clipper device utilizing a pair of Schottky barrier diodes formed on a single substrate.

It is a further object of the present invention to provide an improved diode clipper device in a single package having a pair of axially outwardly extending connecting leads attached thereto.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
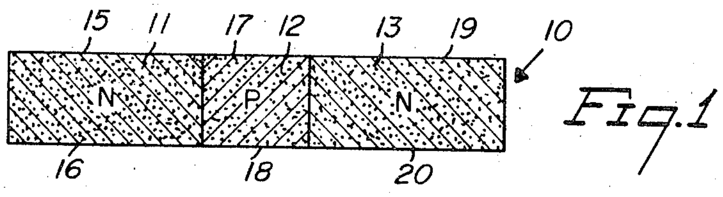
FIGS. 1–4 are cross-sectional views illustrating sequential steps performed during the manufacture of an improved diode clipper device
Figure 2:
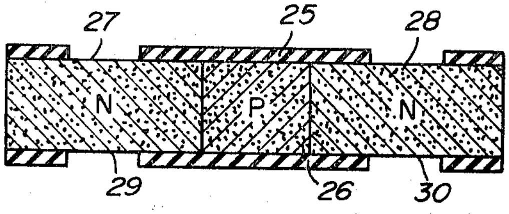
Figure 3:
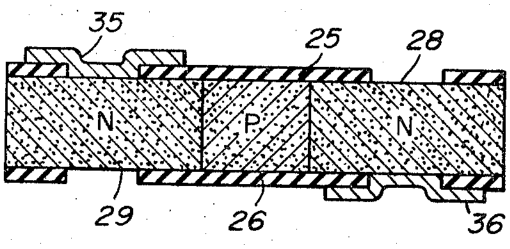
Figure 4:
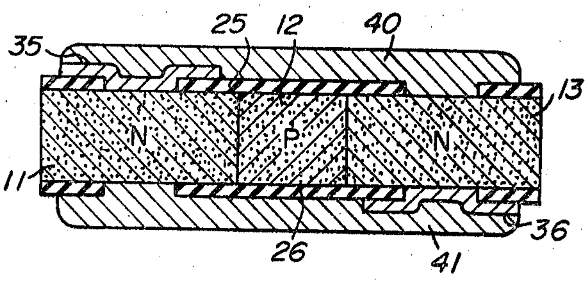

In the FIGS. 1–4, the numeral 10 generally designates a substrate layer or chip of semiconductor material. As illustrated, the substrate layer 10 lies in a horizontal plane and is divided into first, second and third sections 11, 12 and 13, respectively, each extending vertically across the entire thickness of the layer 10. The section 11 has upper and lower surfaces 16 and 16, the section 12 has upper and lower surfaces 17 and 18, and the section 13 has upper and lower surfaces 19 and 20, respectively. The upper surfaces 15, 17 and 19 of the three sections 11, 12 and 13, respectively, define the upper surface of the layer 10 and the lower surfaces 16, 18 and 20 of the sections 11, 12 and 13, respectively, define the lower surface of the layer 10. Thus, the layer 10 is formed with the second section 12 sandwiched between the first and third sections 11 and 19 and complety isolating the first section 11 from the third section 13.

The sections 11 and 13 of the substrate 10 are doped with impurities in a relatively light concentration for providing conductivity of a first type, which in this embodiment is N type. The section 12 is doped with impurities in a relatively light concentration for providing conductivity of a second or the opposite type, which in this embodiment is P type. The three sections 11, 12 and 13 of the substrate 10 may be formed in a variety of ways, such as by providing a chip of semiconductor material of N type conductivity and masking it so that the center section 12 can be formed by diffusion from both major surfaces or the substrate 10 can be a chip of P type conductivity and the sections 11 and 13 can be formed by diffusing impurities from the opposite ends thereof. A variety of other methods of forming the three sections of substrate 10 may be devised by those skilled in the art and it should be understood that the above descriptions are for exemplary purposes only.

Once the substrate 10 is formed with the sections 11, 12 and 13 having the conductivities described above, layers 25 and 26 of insulating material, which may be silicon dioxide or the like, are deposited or otherwise formed over the upper and portion surfaces, respectively, of the substrate 10. An aperture 27 is formed in the upper insulating layer 25 which is somewhat smaller than the upper surface 15 of the section 11 and generally centrally located thereabove to expose a central portion of the upper surface 15 of the section 11. In a similar fashion an aperture 28 is formed in the upper insulating layer 25 above the upper surface 19 of section 13 and apertures 29 and 30 are formed in the lower insulating layer 26 to expose central portions of the lower surfaces 16 and 20, respectively, of the sections 11 and 13. The apertures 27, 28, 29 and 30 can be formed by any well-known convenient method, such as etching or the like.

A layer 35 of metal having an energy level different from that of the semiconductor material forming section 11, is deposited on the exposed portion of the upper surface 15 within the aperture 27. The metal layer 35 forms a Schottky barrier with the semiconductor material of section 11. In a similar fashion a layer 36 is deposited over the exposed portion of the lower surface 20 of section 13 within the aperture 30. Thus the metal layer 35 and section 11 form a first Schottky barrier diode and the layer 36 and section 13 form a second Schottky barrier diode separated by section 12. The layers 35 and 36 can include a wide variety of barrier metals well known to those skilled in the art but in the present embodiment chromium is utilized so that a diode with a turn-on voltage of approximately 0.2 volts is produced. Because the Schottky barrier diodes formed by the junction of metal layers 35 and 36 with semiconductor sections 11 and 13, respectively, turn on at a voltage of approximately 0.2 volts and the semiconductor junctions formed between sections 11 and 12 and between sections 12 and 13 require approximately 0.7 volts to turn on, the section 12 interposed between the sections 11 and 13 effectively separate the two Schottky diodes and prevents substantially any interaction therebetween.

Figure 5:
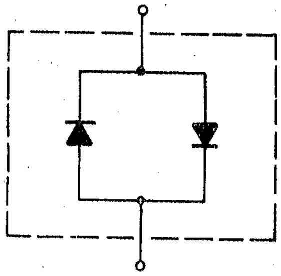
FIG. 5 is a schematic diagram of an improved diode clipper device.

A layer 40 of contact metal is deposited over the insulating layer 25 and barrier metal 35 so as to provide an ohmic contact with the metal layer 35 and the exposed portion of the upper surface 19 of section 13 within the aperture 28. In a similar fashion a layer 41 of contact metal is deposited over the lower insulating layer 26 and the layer 36 of barrier metal to provide an ohmic contact with the barrier metal layer 36 and the exposed portion of the lower surface 16 of the section 11 within the aperture 29. The contact metal forming the layers 40 and 41 can be any of the contact metals well known to those skilled in the art, such as gold, platinum, silver, etc. Thus, the layer 40 connects one anode and one cathode of the Schottky barrier diodes together and the layer 41 connects the opposite cathode and the opposite anode together to form a diode clipper device as illustrated schematically in FIG. 5. Axially outwardly extending contact leads can be attached to the layers 40 and 41 and the device can be encased by any of the methods well known to those skilled in the art.

Figure 6:
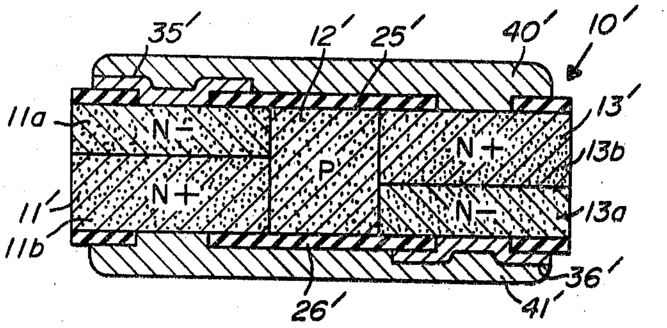
FIG. 6 is a cross-sectional view illustrating a different embodiment of the improved diode clipper device.

Referring specifically to FIG. 6, a different embodiment of the improved Schottky diode clipper device is illustrated wherein each of the Schottky diodes is illustrated as a somewhat more complex diode structure. In this embodiment similar parts are designated with similar numbers having a prime added to indicate the different embodiment. A substrate layer 10' is divided into three sections 11', 12', and 13' as described relative to the previous embodiment. Upper and lower insulating layers 25' and 26' are deposited on the major surfaces of the substrate 10' and barrier metal layers 35' and 36' are deposited in apertures formed therein. Contact metal layers 40' and 41' are deposited over the insulating layers 25' and 26' to form ohmic contact with the two Schottky barrier diodes as described in conjunction with the previous embodiment.

In many applications of the diode clipper device the series resistance thereof must be below some specified upper limit. To provide a diode clipper device with a sufficiently low series resistance may require a relatively thin substrate 10'. To overcome this problem, the embodiment illustrated in FIG. 6 has been constructed with each of the sections 11' and 13' divided into lightly doped layers **11'*a* and 13'*a*, immediately adjacent the barrier metal layers 35' and 36', respectively, and forming Schottky barrier diodes therewith, and heavily doped layers 11'*b* and 13'*b*, immediately adjacent the apertures 28' and 29' and forming ohmic contact with the contact metal layers 40' and 41', respectively. As is well known in the art, heavily doped layers 11'*b* and 13'*b* may typically have a resistivity in the range of about 5 to 10 ohms per centimeter and the lightly doped layers 11'*a* and 13'*a* may typically have a resistivity in the range of about 50 to 150 ohms per centimeter. While the embodiment illustrated in FIG. 6 will be somewhat more complicated to manufacture than the embodiment illustrated in FIGS. 1 through 4**, the accuracy and reliability of the characteristics thereof may be somewhat better.

Thus, an improved diode clipper device is disclosed wherein a pair of diodes connected in opposed parallel relationship are constructed in a single unit with a pair of axially outwardly extending leads attached thereto. By constructing the diodes in a single unit the characteristics thereof can be accurately matched, the device can be made in a single operation and installation and connecting steps are eliminated.

While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. An improved diode clipper device comprising:

*a.* a substrate layer of semiconductor material having two opposed major surfaces;

*b.* said substrate layer being divided into first, second and third sections each having first and second opposed surfaces cooperating to define the two opposed major surfaces of said substrate layer, said first and third sections being separated by said second section, and said first and third setions having an impurity therein for providing conductivity of a first type and said second section having an impurity therein for providing conductivity of a second type;

*c.* a first type of metal deposited on the first surface of said first section and the second surface of said third section for forming two Schottky barrier diodes; and

*d.* a second type of metal deposited on said first type of metal, the second surface of said first section and the first surface of said third section for providing ohmic connection with said first type of metal and said first and third section to connect said Schottky barrier diodes in a parallel opposed relationship.

2. An improved diode clipper device as set forth in claim 1 including in addition layers of insulating material overlying the first and second surfaces of the second section and portions of the first and second surfaces of the first and third sections.

3. An improved diode clipper device as set forth in claim 1 wherein the first type of metal includes chromium.

4. An improved diode clipper device as set forth in claim 1 wherein the second type of metal includes gold.

5. An improved diode clipper device as set forth in claim 1 wherein each of said first and second sections includes a layer of semiconductor material having a relatively low concentration of impurities therein underlying and electrically engaged with the first type of metal and a layer of semiconductor material having a relatively high concentration of impurities therein underlying and electrically engaged with the second type of metal.

6. An improved diode clipper device as set forth in claim 1 wherein the first and third sections of the substrate layer are N type conductivity and the second section is P type.

7. A method of producing an improved diode clipper device including the steps of:

*a*. providing a substrate layer of semiconductor material having two opposed surfaces;

*b*. introducing impurities into said layer to form said layer into first, second, and third sections, each having first and second opposed surfaces cooperative to define the two opposed major surfaces of said substrate layer, said first and third sections being separated by said second section and said first and third sections having a first type of conductivity and said second section having a second type of conductivity;

*c*. depositing barrier metal on the first surface of the first section and the second surface of the third section to form Schottky barrier diodes at opposed surfaces of said substrate layer; and depositing connecting metal on the opposed major surfaces of said substrate layer to connect the Schottky barrier diodes in opposed parallel relationship.

* * * * *